United States Patent
Zhan et al.

(10) Patent No.: US 8,248,280 B2
(45) Date of Patent: Aug. 21, 2012

(54) SUCCESSIVE APPROXIMATION REGISTER (SAR) ANALOG-TO-DIGITAL CONVERTER (ADC) HAVING OPTIMIZED FILTER

(75) Inventors: Sanyi Zhan, Shenzhen (CN); Daniel J. Cooley, Forney, TX (US); Ligang Zhang, Shenzhen (CN)

(73) Assignee: Silicon Laboratories Inc., Austin, TX (US)

( * ) Notice: Subject to any disclaimer, the term of this patent is extended or adjusted under 35 U.S.C. 154(b) by 514 days.

(21) Appl. No.: 12/568,811

(22) Filed: Sep. 29, 2009

(65) Prior Publication Data

US 2011/0075768 A1   Mar. 31, 2011

(51) Int. Cl.
    *H03M 1/06* (2006.01)
(52) U.S. Cl. ........ 341/118; 341/120; 341/121; 341/143; 341/155
(58) Field of Classification Search .......... 341/118–121, 341/143, 155, 172
See application file for complete search history.

(56) References Cited

U.S. PATENT DOCUMENTS

| | | | |
|---|---|---|---|
| 6,567,021 B1 * | 5/2003 | Burns | 341/120 |
| 6,844,840 B1 * | 1/2005 | Melanson | 341/161 |
| 6,940,445 B2 * | 9/2005 | Kearney | 341/163 |
| 7,321,324 B2 | 1/2008 | Piovaccari | |
| 7,358,881 B2 * | 4/2008 | Melanson | 341/144 |
| 7,408,490 B2 * | 8/2008 | Melanson et al. | 341/120 |
| 7,495,589 B1 * | 2/2009 | Trifonov et al. | 341/118 |
| 7,944,386 B2 * | 5/2011 | Hurrell et al. | 341/155 |
| 8,009,072 B2 * | 8/2011 | Rigby et al. | 341/143 |
| 8,111,178 B2 * | 2/2012 | Liao et al. | 341/120 |
| 2008/0258951 A1 * | 10/2008 | Doorenbos et al. | 341/143 |
| 2008/0258959 A1 * | 10/2008 | Trifonov et al. | 341/156 |
| 2009/0261998 A1 * | 10/2009 | Chae et al. | 341/118 |

OTHER PUBLICATIONS

U.S. Appl. No. 12/231,184, entitled "Mechanical Tuning of a Radio," by Shahram Tadayon, filed Aug. 29, 2008.

* cited by examiner

*Primary Examiner* — Linh Nguyen
(74) *Attorney, Agent, or Firm* — Trop, Pruner & Hu, P.C.

(57) ABSTRACT

A system such as a mechanically tuned radio can have a signal path to receive and process an incoming radio frequency (RF) signal and to provide the processed signal to a first analog-to-digital converter (ADC) to convert the processed signal to a digital signal and to digitally demodulate the digital signal to obtain an audio signal, where this first ADC is separate from an auxiliary ADC not part of the signal path.

18 Claims, 5 Drawing Sheets

SUCCESSIVE APPROXIMATION REGISTER (SAR) ANALOG-TO-DIGITAL CONVERTER (ADC) HAVING OPTIMIZED FILTER

BACKGROUND

A common component in many semiconductor devices is an analog-to-digital converter (ADC). In general, an ADC operates by receiving an analog input voltage and converting this voltage into a digital representation. Many different types of ADCs are available.

One particular type of ADC is a so-called successive approximation register (SAR) ADC. In general, a SAR ADC includes various components to receive and process the incoming analog voltage and compare it in a successive manner to a reference value to obtain a final value that is the digital output corresponding to the analog input. Typically, a successive approximation ADC includes a comparator having one input to receive the analog input signal and a second input received from a feedback digital-to-analog converter (DAC) that in turn is coupled to receive a digital code from a SAR that in turn receives the comparator output.

This circuit generally initiates conversion by providing an initial code from the SAR to the DAC (e.g., with its most significant bit (MSB) set at one, and all other bits set at zero). The DAC converts this digital code into a corresponding analog voltage, which is then compared to the analog input voltage. Based on the comparison, the MSB of the SAR is either maintained in its set position if the analog input voltage is greater than the initial code, otherwise this MSB is reset. A similar approximation is then performed successively in turn for each less significant bit until all bits have been updated and the corresponding digital code is provided to the DAC and converted for comparison in the comparator.

SAR ADCs are common ADCs for lower speed applications (e.g., less than approximately 5 mega samples per second (MSPS)) at medium to high resolution (approximately 8 bits to 16 bits). In general, they consume less power and silicon area, but still suffer from drawbacks.

SUMMARY OF THE INVENTION

According to one aspect, the present invention is directed to an analog-to-digital converter (ADC) including a comparator to compare an analog input voltage signal received at a first input with a feedback signal received at a second input, a successive approximation register (SAR) coupled to the comparator, a delta-sigma modulator (DSM) coupled to the SAR to receive an N-bit output and generate a one-bit decision, a digital-to-analog converter (DAC) coupled to the DSM including an inverter and passive low pass filter to convert the one-bit modulated digital signal to an analog feedback signal, which is fed to the second input of the comparator. In one implementation, the LPF may be a fourth-order LPF, and the ADC may have a resolution of greater than 10 bits. The ADC may be used as an auxiliary ADC off of a main signal path of a chip to convert various analog signals. In some implementations, a reference voltage for the DAC may be coherent with a battery voltage.

Another aspect of the present invention is directed to a method including comparing an analog voltage signal received at a first input with a feedback signal received at a second input, updating a bit of a SAR based on the comparison, receiving an N-bit output of the SAR and generating a decision in a DSM, converting the decision to a filtered analog signal in a DAC to provide the feedback signal for the comparison. In some embodiments, a selected analog signal may be received from a multiplexer. As examples, the signals from which the analog signal may be selected include sensor outputs and an output of a potentiometer coupled to a battery voltage, where the potentiometer is user controllable to select a tuning frequency for a desired radio channel.

Embodiments of the present invention can be used in many different systems. As an example, an auxiliary ADC such as described above can be incorporated into a single chip radio tuner. Such tuner may be for a mechanically tuned radio and can have a signal path to receive and process an incoming radio frequency (RF) signal and to provide the processed signal to a first ADC to convert the processed signal to a digital signal and to digitally demodulate the digital signal to obtain an audio signal, where this first ADC is separate from the auxiliary ADC. Still further, the tuner may include a reference voltage generator to receive a battery voltage and generate an attenuated battery voltage that can be provided as a reference voltage to the DAC of the auxiliary ADC.

DETAILED DESCRIPTION

In various embodiments, an analog-to-digital converter (ADC) such as a successive approximation register (SAR) ADC may be formed using a feedback delta-sigma digital-to-analog (DAC). For a SAR ADC, the effective resolution is limited by its feedback DAC. The resolution of a delta-sigma DAC is determined by its output signal-to-noise and distortion ratio (SNDR). Embodiments may improve these performance characteristics using an optimized low pass filter in the feedback loop. That is, because embodiments may be used for an ADC having a high resolution, i.e., a large number of bits, a strong filter is needed, particularly for the finest, i.e., least significant bits. Thus while a lower performance low pass filter may be used when a desired resolution is only a small number of bits (e.g., 5 or less), for higher order resolution implementations a stronger filter is needed. This low pass filter shapes the output noise spectrum of the DAC, while at the same time achieving a fast settling as required by the SAR ADC. Usually, both tasks require a design trade-off, which means that a better SNDR will cause a worse settling time or much larger silicon area. In this way, SNR or resolution of the delta-sigma DAC can be increased and the settling time of the DAC output voltage can be reduced simultaneously, without extra silicon. As such, the resolution of the SAR ADC may be effectively increased. Embodiments may optimize the SNDR and settling time of the delta-sigma DAC simultaneously without increasing the silicon area.

Figure 1:
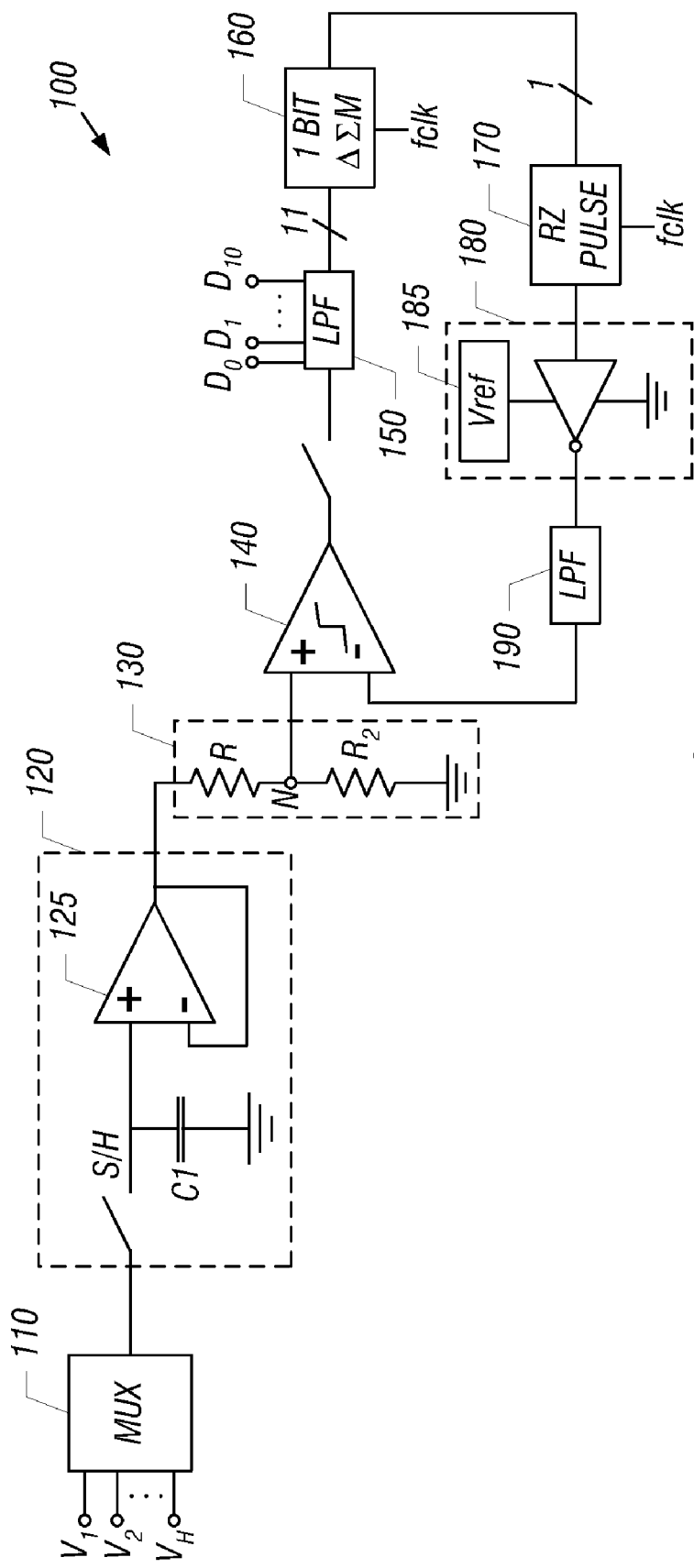
FIG. 1 is a block diagram of an analog-to-digital converter (ADC) in accordance with one of the present invention.

Referring now to FIG. 1, shown is a block diagram of an ADC in accordance with one embodiment of the present invention. As shown in FIG. 1, ADC 100 may be configured as a SAR ADC. In various implementations, the ADC may be used for converting analog input signals to digital outputs. Such an ADC may be used for various features of a semiconductor chip. For example, in one embodiment the ADC may be configured as an auxiliary ADC that is not part of a critical signal path of the semiconductor chip (i.e., not part of the main signal processing path of the chip). Instead, the ADC may be used to perform various conversions relating to different analog signals generated on the chip. For example, the auxiliary ADC may operate under control of a controller to receive inputs from various sensors such as voltage, temperature and process sensors, or in a radio application, control mechanisms such as mechanical knobs for user control of tuning frequency, volume or so forth may be present and in turn the ADC generates a digital output codes corresponding to each such input.

As seen in FIG. 1, circuit 100 may include a multiplexer 110 or other switching mechanism that is coupled to various input sources, e.g., a plurality of analog input voltage signals $V_1$-$V_N$. As described above, in certain implementations these analog voltages may be received from different sensors or other mechanisms present on or off the semiconductor chip. Under control, e.g., of a controller (not shown in FIG. 1), multiplexer 110 may select a corresponding analog voltage to be output to a sample and hold circuit (S/H) 120. S/H 120 may be used to hold the signal at a steady value, so that the input signal does not change during the settling time of the ADC. As seen, S/H 120 may include a capacitor C1 to filter the analog signal and a buffer 125 to buffer the signal. S/H 120 may be switch enabled/disabled, e.g., under control of the controller.

The sample and hold circuit may output an analog signal to an attenuator 130 which may be implemented in one embodiment by a voltage divider. For example, as shown in FIG. 1 a voltage divider having a fixed resistor R1 and a variable resistance R2 may be provided as the attenuator, where an output node N coupled between the resistors is further coupled to a positive input terminal of a comparator 140, which may be implemented using an op-amp, in one embodiment. As seen, comparator 140 may further receive a feedback signal via a negative input terminal. Based on the comparison performed by comparator 140, a comparison signal, which may be at a logic high or low level based on the comparison, is output to a SAR 150. While the present invention is not limited in this regard, in the embodiment of FIG. 1, SAR 150 may be an 11-bit SAR, and thus the resolution of the ADC may be 11 bits.

Based on the comparison output, a corresponding bit of the SAR may either be set or reset. On completion of the successive approximation of all bits, a final digital code may be output from the SAR (e.g., bits D0-D10 shown in FIG. 1), and at this time the pulse output from S/H 120 may be released. In turn, SAR 150 may be coupled to a delta-sigma modulator (DSM) 160. In general, DSM 160 may include an integrator or loop filter (which may be a high-order filter) and a comparator or quantizer to generate a quantized output. More specifically, modulator 160 may be a one-bit DSM coupled to also receive a sampling clock $F_{clk}$. Note that this sampling clock is at a much higher rate than the input signal bandwidth. The output of modulator 160 may be a one-bit signal corresponding to a decision made by the DSM. In general, when the input signal to the DSM is high, the density of 1's output to by the DSM approaches 100%. When this input signal is low, the density of 0's approaches 100%. When the signal is roughly half of the full-scale value, the density is 50% 1's and 50% 0's. The output of the DSM is provided to a pulse generator 170, which in one embodiment may be a return to zero (RZ) pulse generator, also coupled to receive a sampling clock. This generator receives the input from DSM 160 and operates to make all of the 1's and 0's more uniform, thus removing any memory from previous bits. In turn, the pulse generated by pulse generator 170 may be provided to a feedback DAC 180, which in one embodiment may be a one-bit DAC.

As seen in the embodiment of FIG. 1, DAC 180 may generally take the form of an inverter, or two inverters forming a buffer. As seen, the inverter is provided with a reference voltage, $V_{ref}$, which as will be discussed further below may be a coherent reference voltage. The output of DAC 180, which may be a noisy analog signal, is provided to a low pass filter (LPF) 190. This noisy signal is because the output of DSM 160, which generates either a zero or one, is noisy. As the converter needs to reproduce a DC waveform having a value somewhere between logic zero and one, a low pass filter is needed to filter this signal. As will be discussed further below, in various embodiments this filter may be a high-order LPF. The filtered output is provided as a feedback signal to the negative input terminal of comparator 140, as discussed above. The ADC shown in FIG. 1 may be implemented using very small components and thus may have minimal power consumption. While shown with this particular implementation in the embodiment of FIG. 1, the scope of the present invention is not limited in this regard.

Figure 2:
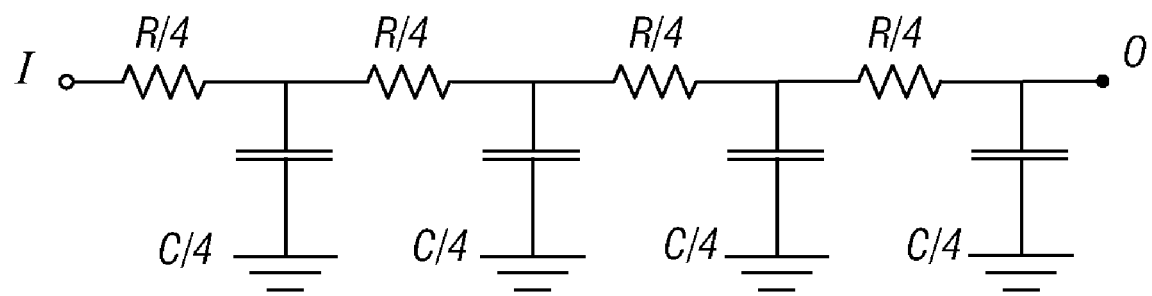
FIG. 2 is a schematic diagram of a filter in accordance with one embodiment of the present invention.

In various embodiments, the low pass filter may be a passive low pass filter, e.g., a RC filter. Referring now to FIG. 2, shown is a schematic diagram of a filter in accordance with one embodiment of the present invention. In various embodiments, an optimum order filter may be in the range of between a second order and eighth order filter. As shown in FIG. 2, filter 190 may be a fourth-order LPF. The filter has an input node I to receive a noisy analog signal and an output node O, which provides a filtered feedback signal, e.g., to the negative input terminal of comparator 140 of FIG. 1. In the embodiment of FIG. 2 the fourth-order filter may be an RC filter including a plurality of serially-coupled resistors R/4, with the nodes between the resistors each having a parallel-coupled capacitor C/4. While the scope of the present invention is not limited in this regard, in an implementation for a complementary metal oxide semiconductor (CMOS) device such as a radio tuner, each resistor R/4 may have a value of between approximately 400 and 2000 kiloohms (kΩ), and each capacitor C/4 may have a value of between approximately 0.4 and 2.0 picoFarads (pF). By using a fourth-order LPF, for a fixed RC time constant or silicon area, a better SNDR and a faster settling for the feedback DAC may be achieved. In one such implementation using a fourth-order LPF, a 10 dB larger SNDR may be realized in comparison to use of a second-order filter.

In applications such as a radio, the input to the ADC may be noisy, e.g., due to other operations occurring in the system. For example, in a mechanically tuned radio application, a potentiometer coupled between a battery voltage and a reference voltage (e.g., ground) allows a user to select a tuning frequency. However, the battery is also driving an amplifier that drives a speaker, which consumes a lot of power when outputting audio. As such, the battery voltage may continually move up and down with the audio output from the radio, and the input to the ADC will also fluctuate. To avoid this fluctuation from affecting conversion, embodiments may cause the reference voltage for the feedback DAC to be coherent with the battery supply. Thus if the battery moves up by 20 millivolts, the reference voltage will also move up by some amount. The input of the ADC thus moves with a noisy battery supply, and the ADC output range becomes insensitive to such changes.

Figure 3:
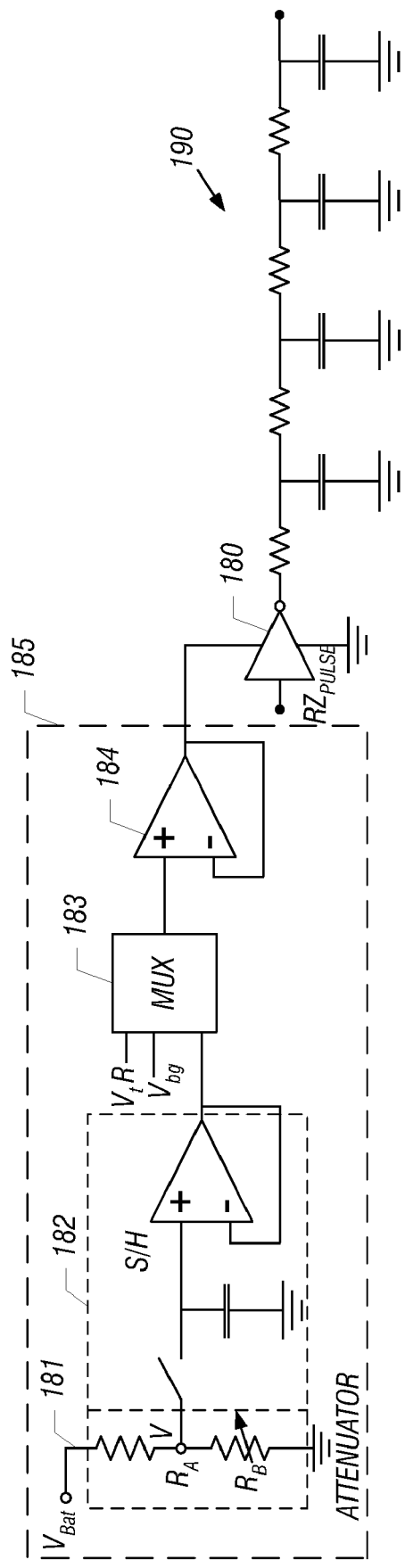
FIG. 3 is a block diagram of a coherent voltage reference generation circuit in accordance with one embodiment of the present invention.

Accordingly, to improve performance in the situation where a battery voltage varies, causing an analog input signal to potentially vary, embodiments may provide a reference voltage for the feedback DAC that is coherent with the battery voltage. Referring now to FIG. 3, shown is a block diagram of a reference voltage generator in accordance with one embodiment of the present invention. As shown in FIG. 3, reference voltage generator 185 may generate the reference voltage that is provided to DAC 180. In various implementations, multiple sources for this reference voltage may be provided. The selection of which reference voltage to use may be set statically when the chip is manufactured, or a dynamic reference voltage may be provided. For example, in implementations in which concern regarding a floating analog input signal is present, e.g., when measuring a potentiometer or other value referred to the battery voltage, a controller may cause reference generator 185 to output a reference voltage that is referenced to the battery voltage.

As shown in FIG. 3, reference generator 185 may include an attenuator 181 coupled to receive the battery voltage $V_{bat}$. As seen in the implementation of FIG. 3, attenuator 181 may include a voltage divider having a fixed resistance $R_A$ and a variable resistance $R_B$. An output node V of the attenuator, which provides an attenuated battery voltage, may be coupled to a sample and hold circuit 182 which may include a switch, capacitor and buffer as discussed above.

The sample and hold circuit may be used because the SAR ADC takes a certain amount of time to produce a result, e.g., several milliseconds. Because this time is during an audio band, the voltage supply might move up or down depending on the level of the audio output. The S/H circuit may hold the value constant while the ADC is working. In turn, the held voltage, which is representative of the battery voltage, is provided to a multiplexer 183. In the embodiment shown in FIG. 3, three voltage inputs may be provided to multiplexer 183. Note that the output pulse from S/H 182 may be the same as the input S/H signal. In addition to the battery reference voltage, a bandgap reference voltage and a voltage independent current supply (e.g., a $V_{T/R}$) reference voltage may also be provided. Multiplexer 183, which may be controlled statically or dynamically, e.g., via a control signal received from a controller such as a microcontroller unit (MCU), may select the voltage reference to be provided through a buffer 184 as the reference voltage for DAC 180. Thus when the battery voltage is selected out of reference generator 185, DAC 180 is sampled directly from the battery voltage. Particularly in applications in which an analog frequency tuning occurs in which the tuning resistors (e.g., of a potentiometer) are supplied by a battery voltage, a coherent sampling may enable better accuracy. While shown with this particular implementation in the embodiment of FIG. 3, the scope of the present invention is not limited in this regard.

For low cost applications such as low end radios and systems including such a radio, a mechanically tuned radio can be implemented without the need for an external varactor or factory alignment, reducing a bill of material, manufacturing costs and size consumed for a given design. In various implementations, a variable impedance, e.g., a variable resistance such as a potentiometer or a variable capacitance, may be provided that is coupled to a tuning mechanism, e.g., a user controlled tuning wheel. This variable impedance may be set at a given level based on the user control. Information regarding the level of the variable impedance can be provided to a controller of the radio, which can in turn control the radio's frequency using this information.

Figure 4:
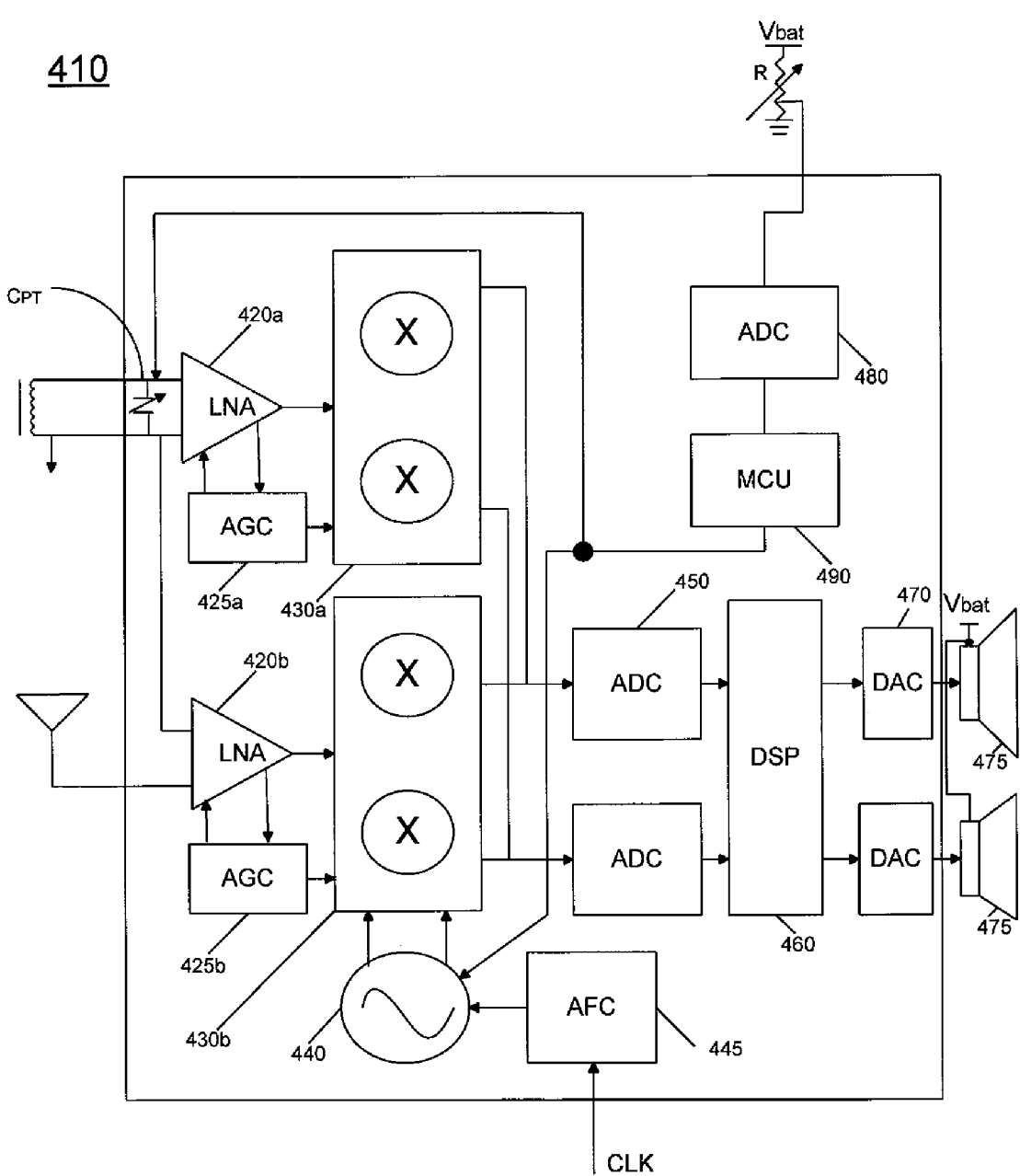
FIG. 4 is a block diagram of a radio receiver in accordance with one embodiment of the present invention.

Referring now to FIG. 4, shown is a block diagram of a radio receiver in accordance with one embodiment of the present invention. As shown in FIG. 4, receiver 410, which may be a fully integrated CMOS integrated circuit (i.e., a single die IC), includes circuitry to receive incoming RF signals, downconvert them to baseband frequency, perform demodulation and provide audio signals therefrom. As shown, incoming signals, which may be received from an AM or FM antenna, are provided to an analog front end that includes low noise amplifiers (LNAs) $420_a$ and $420_b$, respectively, each of which may be controlled in turn by automatic gain control (AGC) circuits $425_a$ and $425_b$. The amplified incoming signals are provided to respective mixers $430_a$ and $430_b$, which perform a mixing operation to downconvert the RF signals to a lower frequency, e.g., an intermediate frequency (IF), a low intermediate frequency (low-IF), zero-IF or baseband frequency.

As shown in FIG. 4, the RF signals are mixed with a local oscillator (LO) signal output from a LO 440. The frequency of LO 440 may be controlled using an automatic frequency control circuit 445 or a PLL, which may receive an incoming clock signal such as may be generated by an off-chip crystal oscillator. Fine tuning of LO 440 may be under control of a microcontroller unit (MCU) 490.

Still referring to FIG. 4, the downmixed signals are provided to an ADC 450 of the main signal path that in turn provides digitized signals to a digital signal processor (DSP) 460, which may perform various signal processing and demodulation operations to obtain the message content in the incoming signals. In turn, digitized message information may be provided to a digital-to-analog converter (DAC) 470, which provides output audio signals corresponding to the message content to, e.g., off-chip speakers 475, which are powered by battery voltage $V_{bat}$. Depending on the output audio signal, the battery level may fluctuate.

As further shown in FIG. 4, a variable resistance, i.e., a potentiometer R, may be coupled to IC 410. As seen, this potentiometer is coupled between a battery voltage and a ground potential. The potentiometer may be controlled by a tuning mechanism of a radio incorporating IC 410. For example, a clock radio, mobile radio, boom box or so forth may have a manual tuning wheel to enable mechanical tuning, rather than by using a digitally controlled tuning mechanism. Accordingly, based on the manual control, a variable voltage is provided to an ADC 480, which may be an auxiliary ADC in accordance with an embodiment of the present invention that converts this voltage into a digital representation, e.g., a digital control signal that in turn is provided to MCU 490. As described above, the battery voltage can also be used to generate a reference voltage for ADC 480. MCU 490 may control the fine tuning of LO 440 based on this control signal to thus enable the radio to tune to the desired channel.

Note in the embodiment of FIG. 4, a pre-select tuning mechanism may be coupled to the input of LNA $420_a$. That is, for AM mode a pre-tuning capacitance $C_{PT}$ may be controlled to enable tuning to a desired frequency. As shown in FIG. 4, MCU 490 may provide a control signal to control this variable capacitance. In one such embodiment, the variable capacitance may be formed of a digitally controlled capacitor array, in which the control signal from MCU 490 may be a digital word, with each bit controlling a switching transistor such as a MOSFET to switch in or out a selected amount of capacitance. To further aid in pre-tuning, a pre-select tuning inductance (which may be off-chip) can be coupled to the pre-select capacitance.

Figure 5:
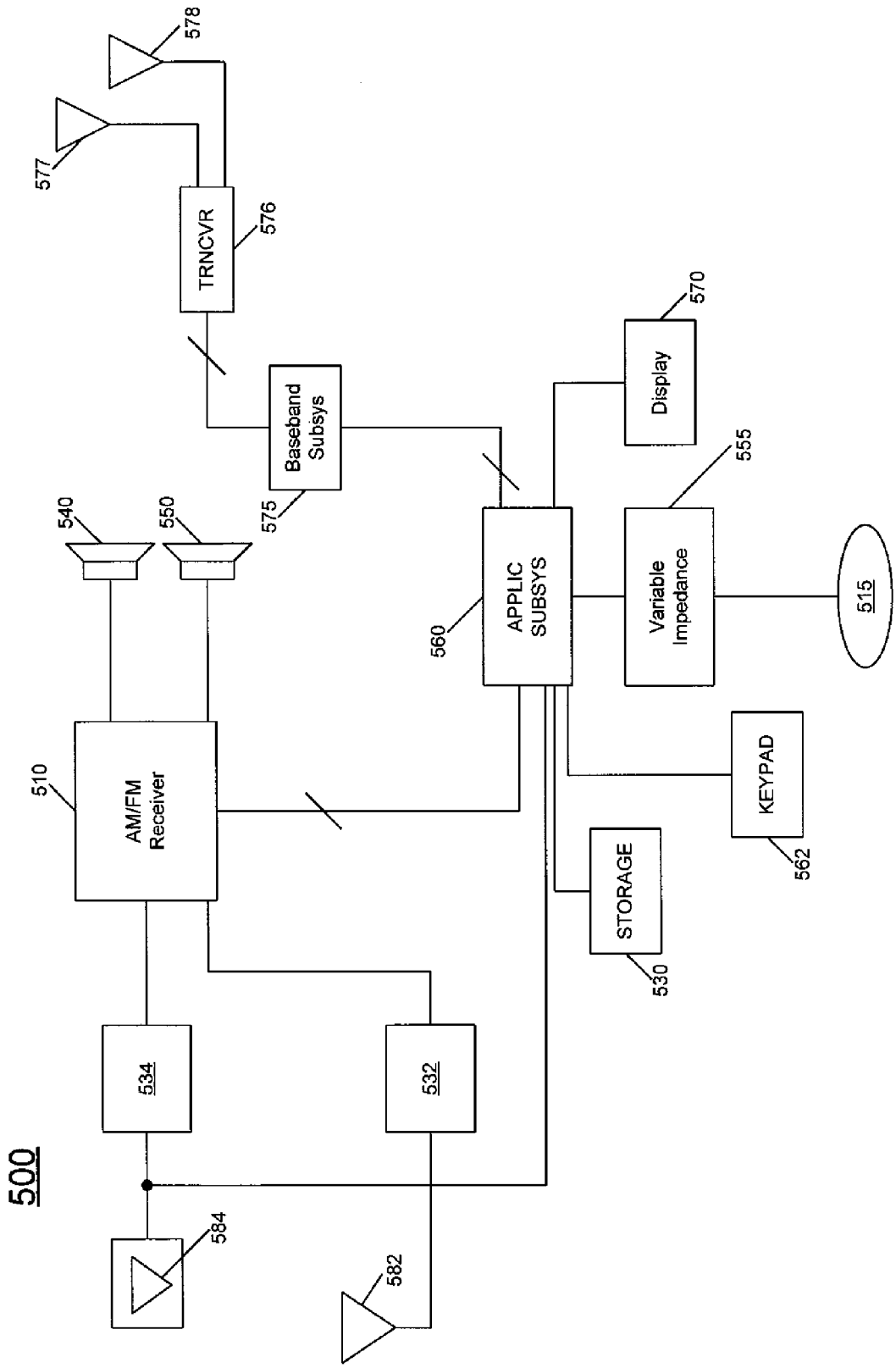
FIG. 5 is a block diagram of a system in accordance with an embodiment of the present invention.

Referring to FIG. 5, in accordance with some embodiments of the invention, an AM/FM receiver 510 (such as an implementation of that shown in the embodiment of FIG. 4) may be part of a multimedia device 500. As examples, the device 500 may be a clock radio, a portable wireless device such as a dedicated MP3 player, a cellular telephone or PDA with audio capabilities, or other such devices.

Among its other functions, the device 500 may store digital content on a storage 530, which may be a flash memory or hard disk drive, as a few examples. The device 500 generally includes an application subsystem 560 that may, for example, receive input from a keypad 562 of the wireless device 500 and display information on a display 570. Furthermore, the application subsystem 560 may generally control the retrieval and storage of content from the storage 530 and the communication of, e.g., audio with the AM/FM receiver 510. As shown, AM/FM receiver 510 may be directly connected to speakers 540 and 550 for output of audio data. As depicted in FIG. 5, the AM/FM receiver 510 may be coupled by a matching network 532 to an FM receiver antenna 582 and may be coupled by a matching network 534 to an AM receiver antenna 584, which can be tunable or programmable, e.g., via application subsystem 560 that provides control information to control a pre-selection capacitance and/or inductance of matching network 534.

As further shown in FIG. 5, application subsystem 560 may further be coupled to a variable impedance 555, e.g., a potentiometer or variable capacitance that is mechanically controlled by a user, e.g., via a tuning wheel 515. Information regarding the variable impedance either by way of voltage or capacitance is provided to application subsystem 560, which may in turn control both an LO of receiver 510 and/or matching network 534 to enable tuning to a desired channel.

In accordance with some embodiments of the invention, device 500 may have the ability to communicate over a communications network, such as a cellular network. For these embodiments, the device 500 may include a baseband subsystem 575 that is coupled to the application subsystem 560 for purposes of encoding and decoding baseband signals for this wireless network. Baseband subsystem 575 may be coupled to a transceiver 576 that is connected to corresponding transmit and receive antennas 577 and 578.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a comparator to compare an analog input voltage signal received at a first input with a feedback signal received at a second input;
   a successive approximation register (SAR) coupled to the comparator and having N-bits of resolution, wherein the SAR is to update a bit of the SAR based on the comparator output;
   a delta-sigma modulator (DSM) coupled to the SAR to receive an N-bit output of the SAR and to generate a one-bit decision; and
   a digital-to-analog converter (DAC) coupled to the DSM to convert the one-bit decision to the feedback signal, and including an inverter and a low pass filter (LPF) to filter and output the feedback signal to the second input of the comparator.

2. The apparatus of claim 1, wherein the LPF comprises a fourth-order LPF.

3. The apparatus of claim 2, wherein N is greater than 10 bits.

4. The apparatus of claim 1, further comprising a multiplexer to receive a plurality of analog signals and select one of the plurality of analog signals to provide to the comparator.

5. The apparatus of claim 4, further comprising a sample and hold circuit coupled to receive the selected analog signal from the multiplexer and to pass a pulse corresponding to the analog input voltage signal that does not vary until the SAR generates a final result.

6. The apparatus of claim 1, wherein the DAC is coupled to receive a reference voltage coherent with a battery voltage.

7. The apparatus of claim 1, further comprising a reference voltage generator to receive a battery voltage and to provide an attenuated battery voltage to a selector.

8. The apparatus of claim 7, wherein the selector is further coupled to receive a bandgap voltage and a third reference voltage and to dynamically select one of the attenuated battery voltage, the bandgap voltage or the third reference voltage to provide as a reference voltage to the DAC.

9. A method comprising:
   comparing an analog voltage signal received at a first input with a feedback signal received at a second input;
   updating a bit of a N-bit successive approximation register (SAR) based on the comparison;
   receiving an N-bit output of the SAR and generating a one-bit decision in a delta-sigma modulator (DSM);
   converting the one-bit decision to an analog signal in a digital-to-analog converter (DAC); and
   filtering the analog signal to provide the feedback signal for the comparison.

10. The method of claim 9, further comprising filtering the analog signal using a fourth-order low pass filter (LPF).

11. The method of claim 9, further comprising operating the DAC using a reference voltage coherent with a battery voltage.

12. The method of claim 9, further comprising receiving a selected analog signal from a multiplexer coupled to receive a plurality of analog signals and passing a pulse corresponding to the selected analog signal that does not vary until the SAR generates a final result, wherein the plurality of analog signals includes a plurality of sensor outputs and an output of a potentiometer coupled to a battery voltage and user controllable to select a tuning frequency for a desired radio channel, wherein the potentiometer output is indicative of the tuning frequency.

13. The method of claim 12, further comprising providing a reference voltage coherent with the battery voltage to the DAC when the potentiometer output is the selected analog signal.

14. A system comprising:
   a mechanically tuned radio having a signal path to receive and process an incoming radio frequency (RF) signal and to provide the processed signal to a first analog-to-digital converter (ADC) to convert the processed signal to a digital signal and to digitally demodulate the digital signal to obtain an audio signal;
   an auxiliary ADC to receive a selected analog signal from a multiplexer and to convert the selected analog signal to a digitized code, the auxiliary ADC including:
      a comparator having a first input to receive the selected analog signal and a second input to receive a feedback signal and to output a comparison signal;
      a successive approximation register (SAR) coupled to the comparator and having N-bits of resolution, wherein the SAR is to update a bit of the SAR based on the comparison signal;
      a one-bit delta-sigma modulator (DSM) coupled to the SAR to receive an N-bit output of the SAR and to generate a one-bit decision;
      a digital-to-analog converter (DAC) coupled to the one-bit DSM to convert the one-bit decision to an analog feedback signal; and a low pass filter (LPF) coupled to the DAC to filter the analog feedback signal and to output the feedback signal to the second input of the comparator, wherein the LPF is at least a fourth-order filter; and a reference voltage generator to receive a battery voltage and generate an attenuated battery voltage therefrom, the reference voltage generator further including a selector to receive the attenuated battery voltage, a bandgap voltage, and a third reference voltage and to dynamically select one of the attenuated battery voltage, the bandgap voltage and the third reference voltage to provide as a reference voltage to the DAC.

15. The system of claim 14, further comprising a potentiometer coupled to the battery voltage and user controllable to select a tuning frequency.

16. The system of claim 15, wherein the auxiliary ADC is coupled to receive an output of the potentiometer as the selected analog signal and to output the digitized code corresponding to the tuning frequency.

17. The system of claim 16, further comprising a microcontroller unit (MCU) coupled to the auxiliary ADC to receive the digitized code and to control at least one analog front end (AFE) component of the mechanically tuned radio based thereon.

18. The system of claim 16, wherein the reference voltage generator is to provide the attenuated battery voltage as the reference voltage to the DAC when the auxiliary ADC is coupled to receive the potentiometer output.

* * * * *